US010070540B2

(12) United States Patent
Campagna et al.

(10) Patent No.: US 10,070,540 B2
(45) Date of Patent: Sep. 4, 2018

(54) ENCLOSED MEDIA DEVICE WITH IMPROVED HEAT TRANSFER CAPABILITIES

(71) Applicant: Peerless Industries, Inc., Aurora, IL (US)

(72) Inventors: Michael A. Campagna, Plainfield, IL (US); Justin Myers, Plainfield, IL (US); Steven Sagerian, Plainfield, IL (US)

(73) Assignee: Peerless Industries, Inc., Aurora, IL (US)

( * ) Notice: Subject to any disclaimer, the term of this patent is extended or adjusted under 35 U.S.C. 154(b) by 0 days.

(21) Appl. No.: 15/596,610

(22) Filed: May 16, 2017

(65) Prior Publication Data

US 2017/0251559 A1  Aug. 31, 2017

Related U.S. Application Data

(63) Continuation of application No. 14/327,952, filed on Jul. 10, 2014, now abandoned.

(51) Int. Cl.
*H05K 5/02* (2006.01)
*H05K 5/00* (2006.01)
(Continued)

(52) U.S. Cl.
CPC ......... *H05K 5/0017* (2013.01); *H05K 5/0013* (2013.01); *H05K 5/0213* (2013.01); *H05K 5/03* (2013.01); *H05K 7/20136* (2013.01)

(58) Field of Classification Search
None
See application file for complete search history.

(56) References Cited

U.S. PATENT DOCUMENTS 5,886,296 A * 3/1999 Ghorbani ........... H05K 7/20181
174/50
6,776,706 B2 * 8/2004 Kipka ................ H05K 7/20181
361/695

(Continued)

FOREIGN PATENT DOCUMENTS

EP          1 928 172       6/2008
WO     WO-2009/135308    11/2009

(Continued)

OTHER PUBLICATIONS

Search Report for European Patent Application No. 15175156.7, dated Nov. 9, 2015, 8 pages.

*Primary Examiner* — Xanthia C Cunningham
(74) *Attorney, Agent, or Firm* — Foley & Lardner LLP

(57) ABSTRACT

A media device enclosure includes a housing with an interior sized and configured to receive a media device therein, a front opening, and a back opening. The media device enclosure further includes a front cover coupled to the housing and configured to cover the front opening and a back cover coupled to the housing and configured to cover the back opening. The media device enclosure further includes a vent plug configured to allow the ingress and egress of air and resistant to liquid ingress, and a check valve configured to allow egress of air. The housing, the front cover, and the back cover form a substantially sealed structure that is resistant to the ingress of liquid or air into the interior.

19 Claims, 2 Drawing Sheets

(51) Int. Cl.
*H05K 5/03* (2006.01)
*H05K 7/20* (2006.01)

(56) References Cited

U.S. PATENT DOCUMENTS

| | | | | |
|---|---|---|---|---|
| 7,116,554 B2* | 10/2006 | Lee | G06F 1/1632 | 165/80.3 |
| 7,929,301 B2* | 4/2011 | Fong | H05K 7/20909 | 165/104.33 |
| 7,957,140 B2* | 6/2011 | Mongia | G06F 1/203 | 165/104.33 |
| 7,974,094 B2* | 7/2011 | Hendrix | H05K 7/20563 | 361/679.5 |
| 8,714,665 B2* | 5/2014 | Campagna | H05K 5/02 | 312/296 |
| 8,824,125 B1 | 9/2014 | Cox et al. | | |
| 2002/0190428 A1* | 12/2002 | Tamura | B29C 45/14336 | 264/259 |
| 2004/0090424 A1* | 5/2004 | Hurley | G09G 5/00 | 345/169 |
| 2004/0131361 A1* | 7/2004 | Bischoff | G06F 3/0421 | 398/116 |
| 2005/0218396 A1* | 10/2005 | Tsuchiya | H01L 27/3246 | 257/13 |
| 2006/0152471 A1* | 7/2006 | Sugawara | G02F 1/133308 | 345/104 |
| 2006/0197721 A1* | 9/2006 | Mizuno | H04N 5/64 | 345/60 |
| 2007/0103865 A1* | 5/2007 | Kim | H05K 7/20972 | 361/694 |
| 2007/0125231 A1* | 6/2007 | Thomas | F16K 15/144 | 96/4 |
| 2008/0123014 A1* | 5/2008 | Lin | H05K 5/0017 | 349/58 |
| 2008/0212286 A1* | 9/2008 | Komatsu | H05K 5/0213 | 361/714 |
| 2010/0171889 A1 | 7/2010 | Pantel et al. | | |
| 2010/0181108 A1* | 7/2010 | Hata | H05K 5/0213 | 174/548 |
| 2010/0315777 A1 | 12/2010 | Dreher | | |
| 2011/0085301 A1 | 4/2011 | Dunn | | |
| 2011/0159795 A1* | 6/2011 | Sprague | H05K 7/20181 | 454/184 |
| 2011/0216482 A1* | 9/2011 | Moscovitch | G06F 1/1601 | 361/679.01 |
| 2011/0275305 A1* | 11/2011 | Egersdoerfer | B65D 77/225 | 454/339 |
| 2012/0051022 A1* | 3/2012 | Dong | G02F 1/133308 | 361/807 |
| 2012/0075809 A1* | 3/2012 | Chen | G06F 1/1626 | 361/724 |
| 2012/0134102 A1* | 5/2012 | Sullivan | G06F 1/1616 | 361/679.43 |
| 2012/0174789 A1* | 7/2012 | Ono | F16K 24/04 | 96/4 |
| 2012/0194971 A1* | 8/2012 | Marker | H05K 5/0004 | 361/679.01 |
| 2012/0206910 A1* | 8/2012 | Watson | F21V 31/005 | 362/218 |
| 2012/0281161 A1* | 11/2012 | Hubbard | G02F 1/133308 | 349/58 |
| 2012/0298330 A1* | 11/2012 | Mysse, III | H05K 5/0213 | 165/96 |
| 2012/0307183 A1* | 12/2012 | Schultz | G02F 1/133308 | 349/84 |
| 2013/0055898 A1* | 3/2013 | Yano | F21S 48/332 | 96/4 |
| 2013/0065103 A1* | 3/2013 | Yumura | E02F 9/0858 | 429/120 |
| 2013/0113167 A1* | 5/2013 | Schwaiger | H05K 5/0017 | 277/641 |
| 2013/0162120 A1* | 6/2013 | Campagna | H04N 5/64 | 312/223.1 |
| 2013/0278120 A1* | 10/2013 | Elkins | H05K 5/0213 | 312/236 |
| 2014/0268600 A1* | 9/2014 | Khoury | H05K 1/111 | 361/752 |
| 2015/0098188 A1* | 4/2015 | Cox | H05K 7/20963 | 361/690 |
| 2015/0306529 A1* | 10/2015 | Yano | B01D 46/0002 | 96/7 |

FOREIGN PATENT DOCUMENTS

| | | |
|---|---|---|
| WO | WO-2011/011704 | 1/2011 |
| WO | WO-2011/059793 | 5/2011 |

* cited by examiner

ENCLOSED MEDIA DEVICE WITH IMPROVED HEAT TRANSFER CAPABILITIES

CROSS-REFERENCE TO RELATED APPLICATIONS

The present application is a continuation of U.S. patent application Ser. No. 14/327,952, filed Jul. 10, 2014, the contents of which are incorporated herein by reference in their entirety.

BACKGROUND OF THE INVENTION

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

In recent years, flat panel televisions have become enormously popular in both commercial and residential sectors. As the prices for plasma, liquid crystal display (LCD) and light-emitting diode (LED) flat panel displays have continued to fall, and the quality for the same devices have improved, more and more businesses and individuals have purchased such devices for both home and business purposes.

The advantages of flat panel displays has also led to expanded application and placement of display devices, including locating display devices in new and challenging and environments. For example, display devices might be located outdoors in various residential and commercial settings for entertainment or marketing purposes, potentially exposing the display device to damaging rain, snow, debris, and other elements. Display devices might also be located in indoor environments such as restrooms, kitchens, and industrial settings for various entertainment, marketing, and informational purposes. It is desirable to protect the display device, which is often quite expensive, from exposure to environmental and other potential contaminants or from tampering. Accordingly, various, sometimes bulky, environmental enclosures have been developed that are intended to protect a display device from the elements and other containments to permit locating such displays outdoors and in other potentially inhospitable environments. The display devices may operate for extended periods and may generate substantial waste heat. Similarly, in an outdoor environment with hot temperatures, the interior temperature within the enclosure may be similarly hot. Effectively venting the interior of the enclosure can improve the performance of the display device by removing excess heat, which may affect the operation of the display device (e.g., overheating electronics components within the electronic device, etc.).

SUMMARY

A media device enclosure, and particularly a television enclosure, includes a housing with an interior sized and configured to receive a media device therein, a front opening, and a back opening. The media device enclosure further includes a front cover coupled to the housing and configured to cover the front opening and a back cover coupled to the housing and configured to cover the back opening. The media device enclosure further includes a vent plug configured to allow the ingress and egress of air and resistant to liquid ingress, and a check valve configured to allow egress of air. The housing, the front cover, and the access cover form a substantially sealed structure that is resistant to the ingress of liquid or air into the interior.

Another embodiment relates to an enclosed media device system. The enclosed media device system includes a media device, and a housing defining an interior sized and configured to receive the media device therein, a front opening, and a back opening. The enclosed media device system further includes a front cover coupled to the housing and configured to cover the front opening and a back cover coupled to the housing and configured to cover the back opening. The enclosed media device system further includes at least one vent plug operatively connected to the back cover and configured to allow the ingress and egress of air, the at least one vent plug and resistant to liquid ingress, and at least one check valve operatively connected to the back cover and configured to allow egress of air from the media device enclosure. The housing, the front cover, and the back cover form a substantially sealed structure that is resistant to the ingress of liquid or air into the interior.

DETAILED DESCRIPTION OF VARIOUS EMBODIMENTS

Figure 1:
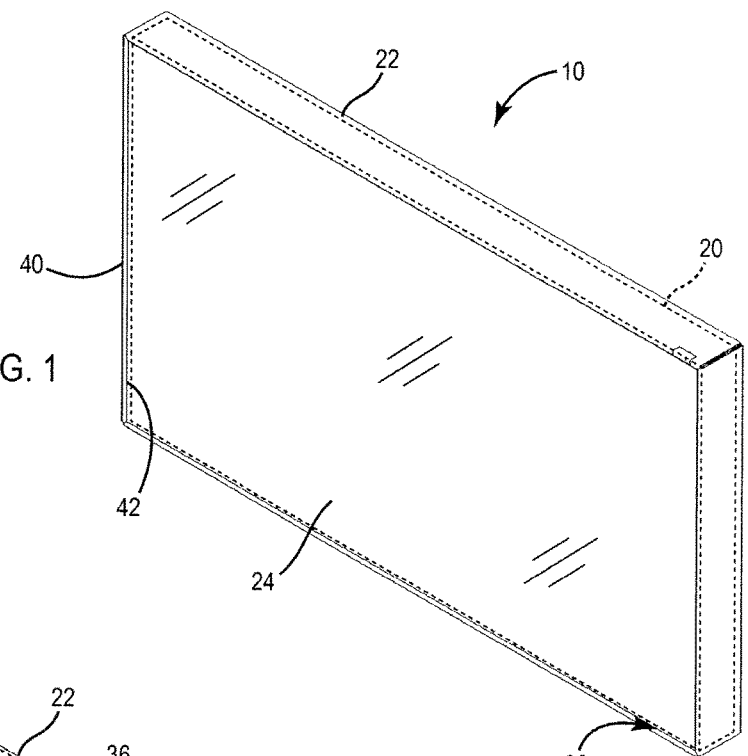
FIG. 1 is a front perspective view of a display device enclosure, according to an exemplary embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Overview of Display Enclosure

FIGS. 1-5 illustrate a display system including a display device 20 such as a LCD, LED or plasma flat panel display device housed within a display enclosure 10. It should be noted that, while element 10 is referred to as a "display enclosure" herein, it is possible for this enclosure to house other media devices, such as projectors, as well. The display enclosure 10 is a protective enclosure configured to enclose the display device 20 so that the display device 20 may be located in an outdoor viewing environment or in other environments where the display device 20 requires or may benefit from protection from ambient conditions. Accordingly, the display enclosure 10 is constructed to resist and substantially prevent ingress of various liquids that may be encountered in the viewing location, including precipitation when the display enclosure 10 is mounted for outdoor viewing of the display device 20. In various embodiments, the display enclosure 10 is constructed to prevent ingress of rain, snow and splashing liquid. In a particular embodiment, the display enclosure 10 is constructed to prevent ingress of liquid at a submersed depth of up to five feet of water, which may correspond to a ingress protection (IP) modified rating of IP65 under the IP Code (the contents of which are incorporated herein by reference).

The display enclosure 10 includes an enclosure chassis or housing 22, a front cover 24, and a back cover 26. The housing 22 is configured to substantially enclose the display device 20 and includes an access opening 32 and a front opening 30 substantially opposite the access opening 32. The front cover 24 is coupled to the housing 22 and covers the front opening 30 of the housing 22. The front cover 24 is a substantially transparent material that permits viewing of the display device 20 within the display enclosure 10. The back cover 26 is coupled to the housing 22 and covers the access opening 32 of the housing 22. A seal member may be disposed about the periphery of the access opening 32 and between the housing 22 and the back cover 26. The back cover 26 may define one or more substantially sealed cable entry openings that permit passage of various power, video, audio, and other data carrying cables to the access opening 32.

Due to ambient conditions and the operation of the display device 20, heat may collect within the interior of the display enclosure 10. Such thermal modulation features may be active and/or passive and provide temperature control within the display enclosure 10 to assist in maintaining an internal temperature within the display enclosure 10 that is within an operating range of the display device 20. According to an exemplary embodiment, the display enclosure 10 includes a thermal modulation system including vent plugs 36 and check valves 38 received in openings defined in the back cover 26. The vent plugs 36 and check valves 38 allow air to pass between the interior of the display enclosure 10 and the outside environment such that excess heat may escape the interior of the display enclosure 10. The vent plugs 36 and the check valves 38 are configured to prevent the ingress of dust, dirt, or other contaminants, thus maintaining an IP65 rating for the display enclosure 10.

Enclosure Housing

The enclosure housing 22 includes an access opening 32 in the rear surface of the enclosure housing 22 and a front opening 30 substantially opposite the access opening 32. The enclosure housing 22 is generally sized such that the display device 20 fits within the region defined by the front opening 30. The access opening 32 provides entry for power and signal cables coupled to a display device 20 disposed within the display enclosure 10.

The enclosure housing 22 is formed from a material having a sufficient strength and rigidity to protect the display device 20, while maintaining a low peripheral profile for the display enclosure 10. According to one exemplary embodiment, the housing 22 is constructed of aluminum to provide a balance of high strength and low weight, yet be resistant to rust or other corrosion typical of expected mounting environments. Aluminum has a relatively high thermal conductivity, and therefore provides a means for removing heat from the interior of the enclosure via conduction through the walls of the housing 22. However, in other embodiments, the housing 22 may be formed of another metal, alloy, or other material (e.g., a polymer material, etc.), especially when used in conjunction with a corrosion resistant coating. Exemplary corrosion resistant coatings are described in U.S. Pat. No. 8,102,483, the contents of which are incorporated herein by reference. The housing 22 may be a single-piece design, or may be formed from a multitude of separate frame members. The frame members may be joined by welding, adhesives, connecting elements, and combinations thereof.

The front portion of the housing 22 forms a bezel 40. The bezel 40 has an inner edge 42 defining the front opening 30. The housing 22 is constructed such that the width of the bezel 40, i.e., the perpendicular distance between the bezel inner edge 42 and the outer periphery of the housing 22, the portion visible when viewing the display enclosure 10 from the front, is minimized.

The display area of the display device 20 is visible through the front opening 30. As such, the housing 22 may be constructed to various dimensions to accommodate display devices 20 of different sizes. For example, the housing 22 may be constructed in accordance with display device 20 screen sizes that are commonly manufactured. In a particular embodiment, the housing 22 is constructed to accommodate a 47 inch display device 20. In other embodiments, the housing 22 may be constructed to accommodate display devices of other sizes (e.g., 32 inch, 55 inch, etc.).

Front Cover

Figure 3:
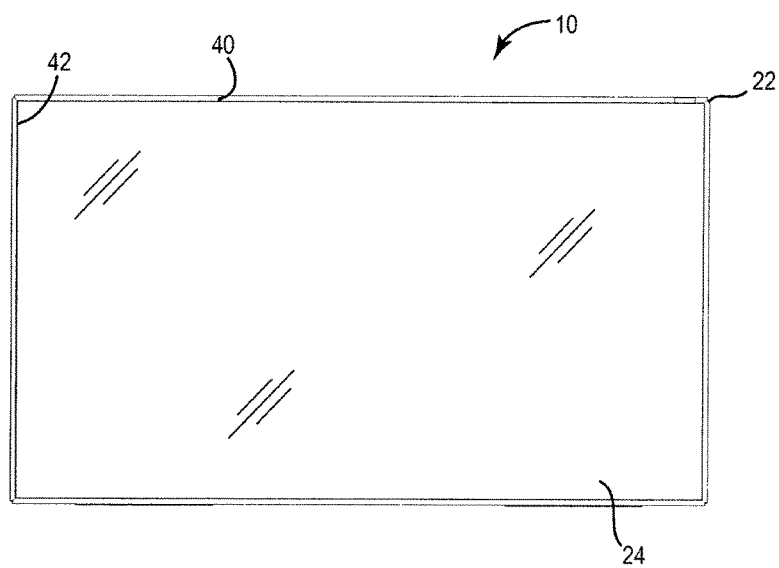
FIG. 3 is a front view of the display device enclosure of FIG. 1.

With reference to FIGS. 1 and 3, the front opening 30 is covered by the front cover 24. The front cover 24 is formed of a substantially transparent material that permits viewing of the display device 20 within the display enclosure 10. Accordingly, the front cover 24 may comprise glass or a substantially transparent plastic. In a particular embodiment, the front cover 24 comprises tempered glass having a thickness of approximately 6 millimeter, though other thicknesses may be used.

The front cover 24 is joined to the housing 22 in a manner that prevents ingress of liquids, dust, and other contaminants into the display enclosure 10 that may be encountered in the mounting environment. For example, the front cover 24 may be bonded to the housing 22 using an adhesive such as a urethane adhesive. The front cover 24 may further include an anti-reflective coating on the front and/or rear surfaces to reduce photopic reflection. The front cover 24 may also be treated to mitigate ambient ultraviolet (UV) light degradation the display device 20. For example, the front cover 24 may include a UV coating configured to shield the display device 20 from at least a portion of ambient UV radiation. In various embodiments, the front cover 24 is of sufficient strength to withstand ambient conditions when the display enclosure 10 is located for outdoor viewing.

In one embodiment, the front cover 24 may be coupled to the inner surface (e.g., interior surface) of the bezel 40. In another embodiment, the front cover 24 may be coupled to the outer surface (e.g., exterior surface) of the bezel 40. The edges of the front cover 24 may be recessed about the thickness of the bezel 40 or the edges of the bezel 40 may be recessed about the thickness of the front cover 24 such that, when it is coupled to the inside surface of the bezel 40, the front cover 24 and the outer surface of the bezel 40 define a substantially smooth surface (e.g., the outer surface of the front cover 24 is neither perceptibly raised above, nor depressed below the outer surface of the bezel 40).

Back Cover

Figure 2:
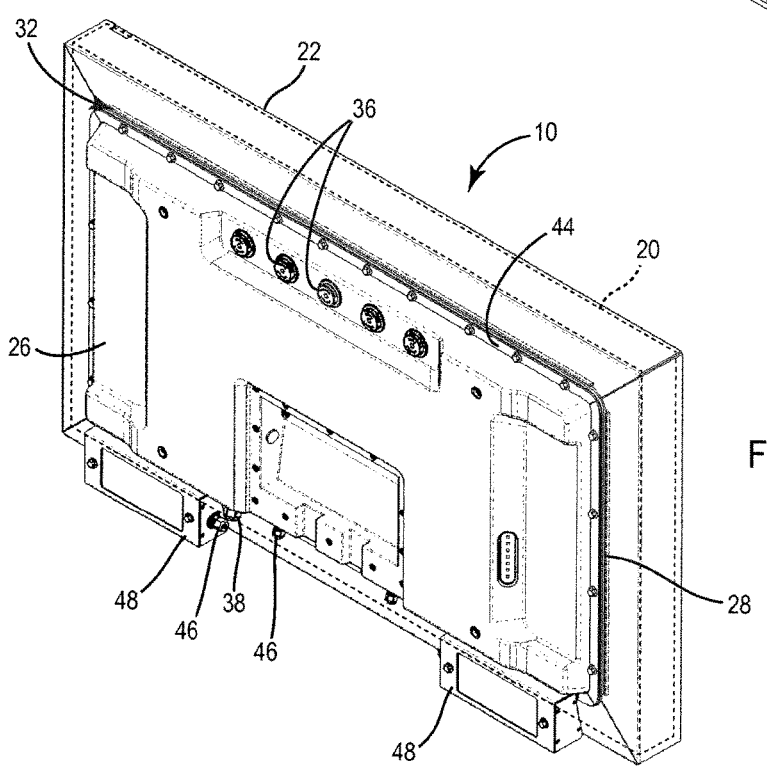
FIG. 2 is a rear perspective view of the display device enclosure of FIG. 1.
Figure 4:
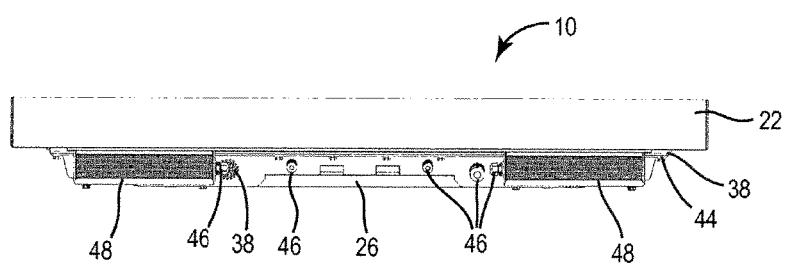
FIG. 4 is a top view of the display device enclosure of FIG. 1.
Figure 5:
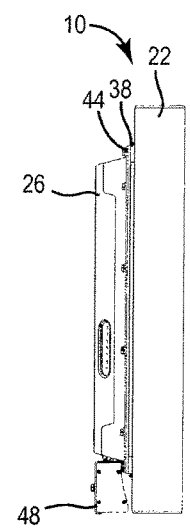
FIG. 5 is a right side view of the display device enclosure of FIG. 1.

As illustrated in FIGS. 2, 4, and 5, the back cover 26 is coupled to the outer surface of the housing 22. The back cover 26 may be contoured (e.g., to accommodate the physical dimensions of the display device 20). According to an exemplary embodiment, the back cover 26 includes an outwardly extending flange 44. When the back cover 26 is positioned over the access opening 32, the flange 44 extends over the housing 22 about the periphery of the access opening 32. The flange 44 is coupled to the housing 22, such as with fasteners (e.g., threaded fasteners) passing through aligned openings in the flange 44 and the housing 22.

The back cover 26 is formed from a material having a sufficient strength and rigidity to protect the display device 20. According to one exemplary embodiment, the back cover is constructed of a UV-resistant polymer material to provide a balance of high strength and low weight, yet be resistant to corrosion and degradation typical of expected mounting environments. However, in other embodiments, the back cover 26 may be formed of another material, such as a metal or alloy. The back cover 26 may be formed to have integrally formed mounting features (e.g., brackets, hooks, sockets, etc.) or mounting bosses to which separate mounting members may be coupled. The display enclosure 10 may be configured to be mounted to a wide variety of structures, such as a pedestal, a wall mount, a ceiling mount, or any other suitable structure.

The back cover 26 is coupled to the housing 22 in a manner that prevents ingress of liquids, dust, and other contaminants into the display enclosure 10. A seal member may be disposed between the back cover 26 and the housing 22. In one embodiment, the seal member may comprise an o-ring or gasket that is squeezed, sealing the interface between the back cover 26 and the housing 22. The seal member may be received in a groove formed in the back cover 26 and/or the housing 22. In the depicted embodiment, the seal member may be a silicone material. In other alternative embodiments, however, the seal member may be another suitable resilient material, such as Teflon, fluorosilicone, urethane, HNBR, polyacrylate, neoprene, butyl, hypalon, rubber, or the like.

Back Cover Openings

The back cover 26 and/or the housing 22 may define openings that access into the interior of the display enclosure 10 for cables (e.g., audio cables, video cables, data cables, power cables, etc.). To prevent such ingress through the openings by liquids, dust, or other contaminants, the openings may include devices such as cable fittings 46 (e.g., cable glands, cord grips, etc.) to seal the openings. The cable fittings 46 may include sealing members formed of any suitable compressible material including, but not limited to Teflon, fluorosilicone, urethane, HNBR, polyacrylate, neoprene, butyl, hypalon, rubber, or the like. The sealing member may include one or more passages to permit cables to pass through the cable entry portion. Cable fittings 46 may be provided, for example, for audio cables running between the interior of the display enclosure 10 and external speakers 48.

Thermal Modulation and Other Features

Various additional thermal control devices may be disposed within or at least partially within the display enclosure 10, to assist in maintaining the internal temperature of the display enclosure 10. Thermal control may be accomplished by including devices intended to add and/or remove heat from the display enclosure 10 depending on ambient conditions and/or the operating conduction of the display device 20. The various thermal control devices may work independently or in concert to assist in modulating the temperature inside the display enclosure 10 within the operating temperature range and/or storage temperature range of the display device 20 under various ambient conditions. According to an exemplary embodiment, the display enclosure 10 includes one or more vent plugs 36 and check valves 38 to allow for air to selectively pass between the outside environment and the interior of the enclosure 10. The vent plugs 36 and the check valves 38 are received in openings defined in the back cover 26.

In a particular embodiment, each vent plug 36 is an IP65 rated vent plug that allows the ingress and egress of air through the opening in the back cover 26 but does not allow the ingress of water or other liquids into the interior of the enclosure 10. The display enclosure 10 may include multiple vent plugs 36. For example, as shown in FIG. 2, the display enclosure 10 may include five vent plugs 36 arranged in a row along the top of the back cover 26. In other embodiments, the enclosure 10 may include more or fewer vent plugs 36 in the cover 26 and/or the housing 22. One exemplary vent plug is a HEYClean™ vent plug manufactured by Heyco®. Such vent plugs are coupled to the back cover 26 with a snap fit and operate under a small back pressure.

In a particular embodiment, the check valves 38 are configured to allow the passage of air in one direction through the opening in the enclosure 10. According to an exemplary embodiment, each check valve 38 is oriented such that allows the egress of air from the interior of the enclosure 10, while preventing the ingress of air into the interior of the enclosure 10. The check valves 38 close under any positive pressure from the outside. The check valves 38 therefore allow air to escape the interior of the enclosure 10 into the exterior environment if the pressure in the interior of the enclosure increases to a pressure a predetermined amount above the external atmospheric pressure. For example, as shown in FIG. 2, the display enclosure 10 may include a check valve 38 positioned on the bottom of the back cover 26. In other embodiments, the enclosure 10 may include more than one check valves 38 in the cover 26 and/or the housing 22.

A back pressure may be created by a blower provided in the interior of the display enclosure 10. The blower may be a separate device provided within the enclosure 10 or may be device provided integrally with the display 20. In one embodiment, the blower is coupled to a thermostat and is configured to activate at a preset threshold temperature. In another embodiment, the blower may be otherwise activated, such as by a timer or a manual control.

When the thermostat detects that the temperature inside the display enclosure 10 exceeds a preset threshold, the blower activates, drawing air from the outside into the interior of the display enclosure through the vent plugs 36. A cross flow ventilation system is therefore provided to control the temperature of the display 20 as the air passes over and through the display 20, removing heat before passing out of the enclosure 10 through the check valves 38. In other embodiments, the display 20 may heated, such as when the enclosure 10 is located in a cold location, such as outside or in a room maintained at a relatively low temperature (e.g., a walk-in freezer, etc.). A heating element may be provided inside the enclosure 10 proximate to the vent plugs 36. When the thermostat detects that the temperature inside the display enclosure 10 is below a preset threshold, the blower activates, drawing air from the outside into the interior of the display enclosure through the vent plugs 36. The air is warmed as it passes over the heating element and warms the display 20 as it passes over and through the display 20 before passing out of the enclosure 10 through the check valves 38.

The vent plugs 36 and the check valves 38 therefore provide a simple mechanism to manage the heat transfer for the display enclosure 10 while preventing the ingress of moisture or other outside contaminants. By managing the heat transfer of the display enclosure, a media device contained within the enclosure 10, such as the display device 20 may be operated within a desired temperature range.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the Figures. It should be noted that the orientation of various elements may differ according to other exemplary embodiments, and that such variations are intended to be encompassed by the present disclosure.

It is important to note that the construction and arrangement of the display device enclosure, as shown in the various exemplary embodiments, are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present invention.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A media device enclosure comprising:
    a housing defining:
        an interior sized and configured to receive a media device therein;
        a front opening; and
        a back opening;
    a front cover coupled to the housing and configured to cover the front opening;
    a back cover coupled to the housing and configured to cover the back opening, the back cover comprising at least one opening defined therein; and
    at least one vent plug operatively connected to the back cover, each of the at least one vent plug positioned within one of the at least one opening, the at least one vent plug allowing the ingress and egress of air into and out of the interior, the at least one vent plug not allowing the ingress of liquids into the interior;
    wherein the housing, the front cover, and the back cover form a substantially sealed structure that is resistant to the ingress of liquid into the interior and resistant to the ingress of air into the interior except via the at least one vent plug.

2. The media device enclosure of claim 1, further comprising a sealing member provided at an interface between housing and the back cover such that the interface between the housing and the back cover is substantially sealed and resistant to liquid ingress.

3. The media device enclosure of claim 1, wherein the interior is sized to receive a flat panel display device.

4. The media device enclosure of claim 1, wherein the media device enclosure has an ingress protection modified rating of IP65.

5. An enclosed media device system comprising:
    a media device;
    a housing defining:
        an interior sized and configured to receive the media device therein;
        a front opening; and
        a back opening;
    a front cover coupled to the housing and configured to cover the front opening;
    a back cover coupled to the housing and configured to cover the back opening, the back cover comprising at least one opening defined therein; and
    at least one vent plug operatively connected to the back cover, each of the at least one vent plug positioned within one of the at least one opening, the at least one vent plug allowing the ingress and egress of air into and out of the interior, the at least one vent plug not allowing the ingress of liquids into the interior,
    wherein the housing, the front cover, and the back cover form a substantially sealed structure that is resistant to the ingress or liquid into the interior and resistant to the ingress of air into the interior except via the at least one vent plug.

6. The enclosed media device system of claim 5, further comprising a sealing member provided at an interface between housing and the back cover such that the interface between the housing and the back cover is substantially sealed and resistant to liquid ingress.

7. The enclosed media device system of claim 5, wherein the media device is a flat panel display device.

8. The enclosed media device system of claim 5, wherein the enclosed media device system has an ingress protection modified rating of IP65.

9. The enclosed media device system of claim 5, wherein the at least one vent plug is provided on a lower half of the back cover.

10. The enclosed media device system of claim 5, further comprising a blower configured to create an airflow through the interior.

11. A media device enclosure comprising:
   a housing defining:
      an interior sized and configured to receive a media device therein;
      a front opening; and
      a back opening;
   a front cover coupled to the housing and configured to cover the front opening;
   a back cover coupled to the housing and configured to cover the back opening, the back cover comprising at least one opening defined therein; and
   at least one check valve operatively connected to the back cover, each of the at least one check valve positioned within one of the at least one opening, allowing one of (i) the ingress of air into the interior and (ii) the egress of air out of the interior, and preventing the other of the (i) the ingress of air into the interior and (ii) the egress of air out of the interior;
   wherein the housing, the front cover, and the back cover form a substantially sealed structure that is resistant to the ingress of liquid into the interior and resistant to the ingress of air into the interior except via the at least one check valve.

12. The media device enclosure of claim 11, further comprising a sealing member provided at an interface between housing and the back cover such that the interface between the housing and the back cover is substantially sealed and resistant to liquid ingress.

13. The media device enclosure of claim 11, wherein the interior is sized to receive a flat panel display device.

14. The media device enclosure of claim 11, wherein the media device enclosure has an ingress protection modified rating of IP65.

15. The enclosed media device system of claim 11, wherein the at least one check valve is provided on a lower half of the back cover.

16. The enclosed media device system of claim 11, further comprising a blower configured to create an airflow through the interior.

17. The enclosed media device system of claim 11, further comprising at least one vent plug operatively connected to the back cover, each of the at least one vent plug positioned within one of the at least one opening, the at least one vent plug allowing the ingress and egress of air into and out of the interior, the at least one vent plug not allowing the ingress of liquids into the interior.

18. The enclosed media device system of claim 11, wherein the at least one check valve allows the egress of air out of the interior and prevents the ingress of air into the interior.

19. The enclosed media device system of claim 11, wherein the at least one check valve allows the ingress of air into the interior and prevents the egress of air out of the interior.

* * * * *